(12) United States Patent
Lin et al.

(10) Patent No.: US 10,817,368 B2
(45) Date of Patent: Oct. 27, 2020

(54) UNIDIRECTIONAL BIT ERROR CORRECTING METHOD FOR OTP ROM

(71) Applicant: Espressif Systems (Shanghai) Co., Ltd., Shanghai (CN)

(72) Inventors: Hao Lin, Shanghai (CN); Rui Zhan, Shanghai (CN)

(73) Assignee: Espressif Systems (Shanghai) Co., Ltd., Shanghai (CN)

(*) Notice: Subject to any disclaimer, the term of this patent is extended or adjusted under 35 U.S.C. 154(b) by 0 days.

(21) Appl. No.: 16/311,419

(22) PCT Filed: Aug. 18, 2016

(86) PCT No.: PCT/CN2016/095831
§ 371 (c)(1),
(2) Date: Dec. 19, 2018

(87) PCT Pub. No.: WO2017/219478
PCT Pub. Date: Dec. 28, 2017

(65) Prior Publication Data
US 2019/0324842 A1 Oct. 24, 2019

(30) Foreign Application Priority Data
Jun. 20, 2016 (CN) .......................... 2016 1 0444153

(51) Int. Cl.
*G06F 11/10* (2006.01)
*H03M 13/25* (2006.01)
(Continued)

(52) U.S. Cl.
CPC ........... *G06F 11/10* (2013.01); *H03M 13/255* (2013.01); *H03M 13/2957* (2013.01); *H03M 13/41* (2013.01)

(58) Field of Classification Search
CPC .................................................. H03M 13/2957
(Continued)

(56) References Cited

U.S. PATENT DOCUMENTS

2003/0217322 A1* 11/2003 Rodgers ............... G06F 11/006
714/763
2008/0084273 A1 4/2008 Rodgers et al.
(Continued)

FOREIGN PATENT DOCUMENTS

CN 1787102 A 6/2006
CN 102043646 A 5/2011
(Continued)

*Primary Examiner* — Fritz Alphonse
(74) *Attorney, Agent, or Firm* — Reinhart Boerner Van Deuren P.C.

(57) ABSTRACT

The present invention discloses a unidirectional bit error correction method for a OTP ROM, comprising: applying error correction encoding to bit information and writing the bit information to the OTP ROM; during power-up initialization, converting hard bit information read out from the OTP ROM to soft bit information; during the power-up initialization, performing error correction decoding through a soft bit decoder. The advantages of the present invention include: utilizing otherwise temporarily idle decoding modules in the chip, without requiring additional hardware resource, while providing stronger error correction capability to the OTP ROM, improving the stability of chip applications, prolonging chip service life, and significantly reducing rejection rate in chip production.

6 Claims, 2 Drawing Sheets

(51) Int. Cl.
*H03M 13/29* (2006.01)
*H03M 13/41* (2006.01)

(58) Field of Classification Search
USPC .......................................................... 714/786
See application file for complete search history.

(56) References Cited

U.S. PATENT DOCUMENTS

2008/0316789 A1* 12/2008 Fredeman .............. G11C 17/16
365/96
2014/0009374 A1* 1/2014 Yamamoto ............ H03K 5/084
345/89
2017/0366596 A1* 12/2017 Han ..................... H04L 1/0006

FOREIGN PATENT DOCUMENTS

| CN | 102508732 A | 6/2012 |
| CN | 104598408 A | 5/2015 |

* cited by examiner

| Factory ID | MAC Address | Software initialization | RF tuning |
|---|---|---|---|
| 10 bytes | 6 bytes | 6 bytes | 6 bytes |

Fig. 1

UNIDIRECTIONAL BIT ERROR CORRECTING METHOD FOR OTP ROM

TECHNICAL FIELD

The present invention relates to the field of communication chips, more particularly to a unidirectional bit error correction method for an OTP ROM.

BACKGROUND ART

With the development of Very-Large-Scale-Integration (VLSI) circuit technologies, chips of various functions have been developed and are widely used in the applications of different fields. OTP ROM (One Time Programmable Read-Only Memory) is a common type of memory deployed in chips with the advantages of small volume, persistence of information in power loss, low cost, and programmable on-chip. Moreover, due to its one-time programmable feature, OTP ROM is usually deployed to store unmodifiable important data in the chip, such as chip ID, MAC address, and RF tuning information. These important data are written into the OTP ROM by means of physical fusing, with connection representing "0" and fusing representing "1".

However, during the production or application of chips, due to various causes such as static electricity produced by certain particular environment factors, or chip aging, OTP ROM may experience erroneous fusing, i.e., 0-to-1 unidirectional bit error. The unidirectional bit errors with OTP ROMs are extremely difficult to be found. If no any protection measure for error correction is taken, such unidirectional bit error may cause the chip to fail to operate, lower its operating performance, or shorten the service life of the chip, thereby significantly reducing chip yield rate.

In view of the above described unidirectional bit error of OTP ROM, conventional error correction protection measures are usually simple hard bit error correction encoding/decoding modes with very limited error correction capability.

However, communication chips are usually integrated with an error correction decoder which utilizes soft bit information and has relatively advanced error correction capability, such as Viterbi decoder, Turbo decoder, and LDPC decoder. When the chip is powered up to parse the content in the OTP ROM, these decoders are in idle state because no communication link is established yet.

SUMMARY OF THE INVENTION

An object of the present invention is to provide a unidirectional bit error correction method for an OTP ROM, which may apply error correction operations to unidirectional bit errors of the OTP ROM in the chip, so as to prevent bit errors of the OTP ROM due to static electricity during use, aging, etc. from causing the chip to fail to operate normally, and ensure a stable operating state of the chip.

The present invention adopts the following technical solution:

a unidirectional bit error correction method for an OTP ROM, comprising:

applying error correction encoding to bit information and writing the bit information to the OTP ROM;

during power-up initialization, converting hard bit information read out from the OTP ROM to soft bit information;

during the power-up initialization, performing error correction decoding through a soft bit decoder.

Applying error correction encoding to bit information to be written may particularly comprise:

applying corresponding encoding to the bit information to be written and adding redundancy check bit information thereto.

During the power-up initialization, performing error correction decoding through a soft bit decoder may particularly comprise: converting a read-out, encoded hard bit stream to a soft bit stream, and inputting the soft bit stream to a corresponding soft bit decoder for error correction decoding, so as to correct one or more 0-to-1 unidirectional bit errors that might already occur.

The soft bit decoder may be one of a Viterbi decoder, a Turbo decoder, or an LDPC decoder, or combination thereof.

A corresponding encoding mode may be selected according to a decoding mode of the soft bit decoder.

The original bit information requiring error correction encoding may be all the bit information to be written into the OTP ROM, or bit information for specific locations prone to fusing in the OTP ROM.

The advantages of the present invention include: utilizing otherwise temporarily idle decoding modules in the chip, without requiring additional hardware resource, while providing stronger error correction capability to the OTP ROM, improving the stability of chip applications, prolonging chip service life, and significantly reducing rejection rate in chip production.

BRIEF DESCRIPTION OF THE DRAWINGS

The present invention will be described in further detail with reference to the embodiments and the appended drawings, in which:

FIG. 1 is a schematic diagram of information structure in an OTP ROM according to an embodiment of the present invention.

DETAILED DESCRIPTION OF THE EMBODIMENTS

Figure 2:
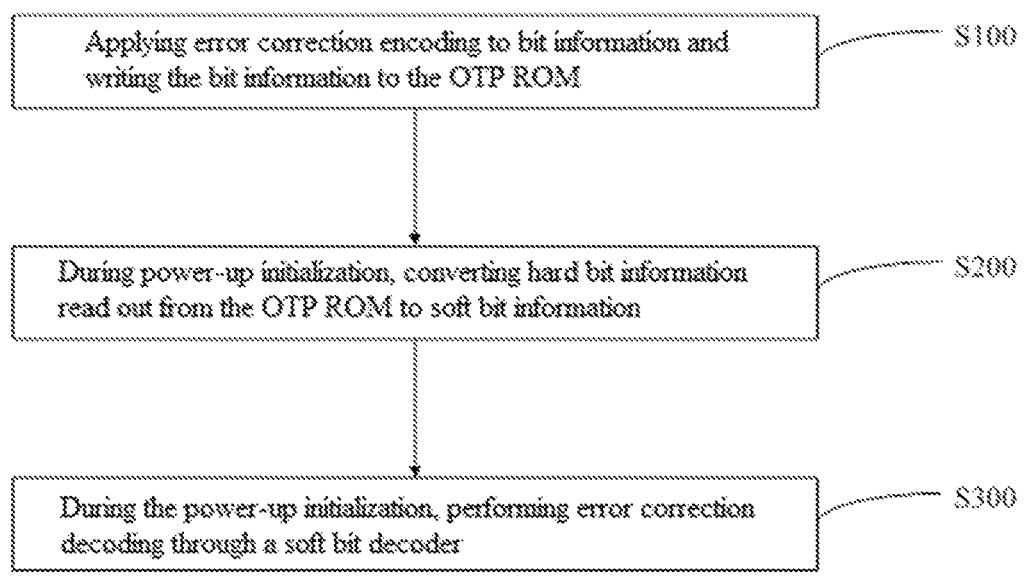
FIG. 2 is a schematic flow diagram of the present invention.

The particular embodiments of the present invention will be further described in the following with reference to the appended drawings:

As shown in FIG. 2, the present invention discloses a unidirectional bit error correction method for an OTP ROM, comprising:

S100, applying error correction encoding to bit information and writing the bit information to the OTP ROM;

S200, during power-up initialization, converting hard bit information read out from the OTP ROM to soft bit information;

S300, during the power-up initialization, performing error correction decoding through a soft bit decoder.

The method of the present invention utilizes a soft bit decoder to correct unidirectional bit errors of the OTP ROM, and utilize otherwise temporarily idle decoding modules of the chip, without requiring additional hardware resource, while providing stronger error correction capability to the OTP ROM, improving the stability of chip applications, prolonging chip service life, and significantly reducing rejection rate in chip production.

Through shared utilization of idle error correction decoders on the chip for communication soft bits during power-up, the present invention provides stronger error correction capability for unidirectional bit errors of the OTP ROM, i.e., during writing the OTP ROM on the chip, adding corresponding error correction codes to the original bit information to be written; during the power-up initialization of the chip, hard bit information read out from the OTP ROM is converted to soft bit, and a soft bit decoder temporarily in idle state during the power-up initialization is used for error correction decoding, so as to correct 0-to-1 unidirectional bit errors that may be present in the OTP ROM.

In the present invention, applying error correction encoding to bit information to be written may particularly include: applying corresponding encoding to the bit information to be written and adding redundancy check bit information.

In the present invention, during the power-up initialization, performing error correction decoding through a soft bit decoder may particularly include: converting a read-out, encoded hard bit stream to a soft bit stream, inputting the soft bit stream to a corresponding soft bit decoder for error correction decoding, so as to correct one or more 0-to-1 unidirectional bit errors that might already occur.

During the power-up initialization of the chip, encoded initialization information is firstly read out from the OTP ROM; a read-out, encoded hard bit stream is converted to a soft bit stream; and the soft bit stream is inputted to a corresponding soft bit decoder for error correction decoding, so as to correct one or more 0-to-1 unidirectional bit errors that already occur.

In the present invention, the soft bit decoder may be one of a Viterbi decoder, a Turbo decoder, or an LDPC decoder, or combination thereof; and a corresponding encoding mode is selected according to the decoding mode of the soft bit decoder.

During the process of writing important information into the OTP ROM of the chip, firstly a corresponding encoder is selected according to the soft bit decoder to be used, such as a convolution encoder, a Turbo encoder, an LDPC encoder; and corresponding encoding is applied to the bit information stream to be written, adding redundancy check bit information, and then the bit information stream is written into the OTP ROM of the chip.

Different encoding protection modes may also be mixedly used; for example, according to different security levels of data, more complicated error correction encoding protection that requires a soft bit decoder may be applied to critical data, while simple error correction encoding protection or no error correction encoding protection may be applied to other data of lower security levels.

The original bit information requiring error correction encoding may be all the bit information to be written into the OTP ROM, or bit information for specific locations prone to fusing in the OTP ROM.

The method of the present invention for encoding and writing, and power-up reading and decoding may be applied to all the bit information to be written into the OTP ROM; alternatively, according to process conditions and specific locations prone to fusing in the OTP ROM, only a portion of information bits that may be influenced by 0-to-1 unidirectional bit errors due to fusing is encoded before being written, and decoding operations are solely applied to this portion of encoded information bits after being read out during power-up.

The process for converting the encoded hard bit in the OTP ROM, after being read out during power-up to soft bit, may apply different conversion methods according to needs.

The chip in the embodiments of the present invention may be a Wi-Fi chip that supports 802.11g and is integrated with a convolutional code encoder(s) with ½, ¾, ⅔, and ⅚ rates, and a corresponding Viterbi decoder. Here, the Viterbi decoder requires a soft bit input of 4-bit length, i.e., in a soft bit numeric range of [−7, 7]. Information to be written into OTP ROM for the chip may include: chip factory ID of 10 bytes; MAC address of 6 bytes; power-up software initialization information of 6 bytes; and RF tuning information of 6 bytes. The total is 28 bytes, as shown in FIG. 1.

First embodiment: a scenario where encoding protection is applied to all the 28 bytes information.

A ½ convolutional code encoder is selected, which requires additional 6 inserted bits, and then the total amount of the encoded data becomes: (28*8+6)*2=460 bits, which will occupy a space of 58 bytes. Subsequently, the encoded data is written into the OTP ROM of the chip by a writer.

During power-up initialization of the chip, the hard bit information of 58 bytes is read out from the OTP ROM. The soft bit generation method includes: 0→−7, and 1→1. The generated soft bit stream is inputted into the Viterbi decoder for decoding, and then the starting 28 bytes of the output stream of the decoder are taken, i.e., to obtain the original information data with error corrected.

Second embodiment: a scenario where a tail portion of the OTP ROM is prone to static electricity burn through.

In the present embodiment, a tail portion of the OTP ROM in the chip is prone to static electricity burn through. During writing, if the last 2 bytes of 6 bytes for the power-up software initialization information, and 6 bytes for RF tuning information were written to that tail portion prone to fusing, then the inflicted 8 bytes may require encoding protection to be applied. The ½ convolutional code encoder is selected, with additional 6 inserted bits, and then the total amount of the encoded data becomes: 20*8+(8*8+6)*2=300 bits, which will occupy a space of 38 bytes, then the encoded data are written into the OTP ROM of the chip by a writer.

During power-up initialization of the chip, the hard bit information of 38 bytes is read out from the OTP ROM, and the last 18 bytes thereof are converted to soft bits according to the soft bit generation approach described in the first embodiment. The generated soft bit stream is inputted to a Viterbi decoder for decoding; and the starting 8 bytes of the output stream from the decoder are taken, i.e., to obtain the original information data with error corrected.

Third embodiment: a scenario where encoding protection is applied to critical information.

Software initialization information and RF tuning information in the information to be written belong to critical information; if error occurs with the two portions of information, the operating performance of the chip may be seriously reduced, even unable to operate normally. Thus, as considered for certain applications, encoding protection may be prioritized to be applied to the two portions.

A ½ convolutional code encoder is selected, with additional 6 inserted bits, then the total amount of the encoded data becomes: 16*8+(12*8+6)*2=332 bits, which will occupy a space of 42 bytes. Then the encoded data are written into the OTP ROM of the chip by a writer.

During power-up initialization, the hard bit information of 42 bytes is read out from the OTP ROM, and the last 26 bytes thereof are converted to soft bits according to soft bit generation approach described in the first embodiment. The generated soft bit stream is inputted to a Viterbi decoder for decoding; and the staring 12 bytes of the output stream from the decoder are taken, i.e., to obtain the original software initialization and RF tuning information data with error corrected.

The above described are merely preferred embodiments of the present invention, without limiting the present invention; and any modification, equivalent substitution and improvement made within the spirit and principles of the present invention, shall fall within the scope of protection of the present invention.

The invention claimed is:

1. A unidirectional bit error correction method for an one time programmable read-only memory (OTP ROM) in a chip, comprising:

applying error correction encoding to bit information and writing the bit information to the OTP ROM;

during power-up initialization of the chip, converting hard bit information read out from the OTP ROM to soft bit information;

during the power-up initialization, performing error correction decoding through a soft bit decoder.

2. The unidirectional bit error correction method for an OTP ROM according to claim 1, wherein applying error correction encoding to bit information to be written particularly comprises:

applying corresponding encoding to the bit information to be written and adding redundancy check bit information thereto.

3. The unidirectional bit error correction method for an OTP ROM according to claim 2, wherein during the power-up initialization, performing error correction decoding through a soft bit decoder particularly comprises: converting a read-out, encoded hard bit stream to a soft bit stream, and inputting the soft bit stream to a corresponding soft bit decoder for error correction decoding, so as to correct one or more 0-to-1 unidirectional bit errors.

4. The unidirectional bit error correction method for an OTP ROM according to claim 1, wherein the soft bit decoder is one of a Viterbi decoder, a Turbo decoder, or an LDPC decoder, or combination thereof.

5. The unidirectional bit error correction method for an OTP ROM according to claim 4, wherein a corresponding encoding mode is selected according to a decoding mode of the soft bit decoder.

6. The unidirectional bit error correction method for an OTP ROM according to claim 1, wherein original bit information requiring error correction encoding is all the bit information to be written into the OTP ROM, or bit information for specific locations prone to fusing in the OTP ROM.

* * * * *